United States Patent [19]

Lee

[11] Patent Number: 5,707,686
[45] Date of Patent: Jan. 13, 1998

[54] METHOD FOR PREVENTING MOISTURE FROM BEING ABSORBED INTO IMPURITY-CONTAINED INSULATING LAYER

[75] Inventor: Sahng Kyoo Lee, Kyoungkido, Rep. of Korea

[73] Assignee: Hyundai Electronics Industries Co., Ltd., Kyoungkido, Rep. of Korea

[21] Appl. No.: 558,585

[22] Filed: Oct. 31, 1995

[30] Foreign Application Priority Data

Nov. 2, 1994 [KR] Rep. of Korea ............... 1994-28665

[51] Int. Cl.$^6$ ...................................................... B05D 3/12
[52] U.S. Cl. .......................... 427/240; 427/343; 427/344; 427/384; 437/231
[58] Field of Search ................................. 427/240, 384; 437/231, 343, 344

[56] References Cited

U.S. PATENT DOCUMENTS

| | | | |
|---|---|---|---|
| 4,753,819 | 6/1988 | Shimada | 427/96 |
| 5,108,784 | 4/1992 | Anderson et al. | 427/0 |

*Primary Examiner*—Janyce Bell
*Attorney, Agent, or Firm*—Jacobson, Price, Holman & Stern, PLLC

[57] ABSTRACT

A method for preventing moisture from being absorbed into an impurity-contained insulating layer is disclosed, including the steps of: forming an impurity-contained insulating layer on a substrate; and coating a material of an alcohol group on the impurity-contained insulating layer, to form an alcohol film.

3 Claims, 1 Drawing Sheet

METHOD FOR PREVENTING MOISTURE FROM BEING ABSORBED INTO IMPURITY-CONTAINED INSULATING LAYER

BACKGROUND OF THE INVENTION

The present invention relates to a method for fabricating an impurity-contained insulating layer which is used for insulation between layers and planarization in fabricating a semiconductor device, and more particularly, to a method for preventing moisture from being absorbed into impurity-contained insulating layer, which prevents a transformation of the nature of an impurity-contained insulating layer caused due to moisture absorption when the layer is exposed to the air.

Generally, Boro-silicate glass (BPS), phospho-silicate glass (PSG) and borophospho-silicate glass (BPSG) layer are impurity-contained insulating layer which are oxide containing boron (B) or phosphorus (P), and they are used for insulation between layers and planarization.

In a conventional method of fabricating an impurity-contained insulating layer, the impurity-contained insulating layer is formed by reaction of gases through chemical vapor deposition method. In case of BPSG layer, a material containing B or P like $PH_3$ and $B_2H_6$ is added during deposition of oxide, to form compound oxide of $SiO_2$—$P_2O_5$—$B_2O_3$. That is, when $P_2O_5$ or $B_2O_3$ is added to $SiO_2$, B or P is contained in silicate glass in an appropriate concentration, to form BPSG layer. Here, the BPSG layer is SiH and TEOS group. A chemical reaction formula of BPSG will be described below.

The more the concentration of B or P is high, the more planarization is improved. However, this impurity-contained insulating layer easily absorbs moisture when it is exposed to the air, transforming the nature of the layer. The aspect ratio is increased according to the development of the high-integrated device. To planarize this high-integrated device, the flow characteristics of the insulating layer for planarizing must be improved by increasing the concentration of the impurity contained in insulating layer. Therefore, moisture absorption becomes larger according to increment of the concentration of the impurity contained in layer.

When moisture content in the insulating layer is increased due to increment of the moisture absorption, the nature of the layer is transformed. This deteriorates the flow characteristics of the layer during following heat treatment at high temperature above 800. Moreover, an alien material can be grown on the surface of the layer due to absorption of moisture, obstructing successive procedure.

In a prior art, in case that the dopant concentration of the impurity-contained insulating layer is high, low concentration impurity-contained insulating layer is thinly deposited or hexa methyl disilagane (HMDS) is coated in order to prevent moisture absorption. However, this conventional method requires great expenses.

SUMMARY OF THE INVENTION

It is an object of the present invention to provide a method for preventing moisture from being absorbed into an impurity-contained insulating layer, which restrains moisture absorption of the impurity-contained insulating layer easily and economically.

To accomplish the object of the present invention, there is provided a method for preventing moisture from being absorbed into an impurity-contained insulating layer including the steps of: forming an impurity-contained insulating layer on a substrate; and coating a material of an alcohol group on the impurity-contained insulating layer, to form an alcohol film.

BRIEF DESCRIPTION OF THE ATTACHED DRAWINGS

FIGS. 1A to 1C are cross-sectional views of sequential process for preventing moisture from being absorbed into an impurity-contained insulating layer according to an embodiment of the present invention.

DETAILED DESCRIPTION OF THE INVENTION

A preferred embodiment of the present invention will be explained below with reference to the accompanying drawings.

Figure 1A:
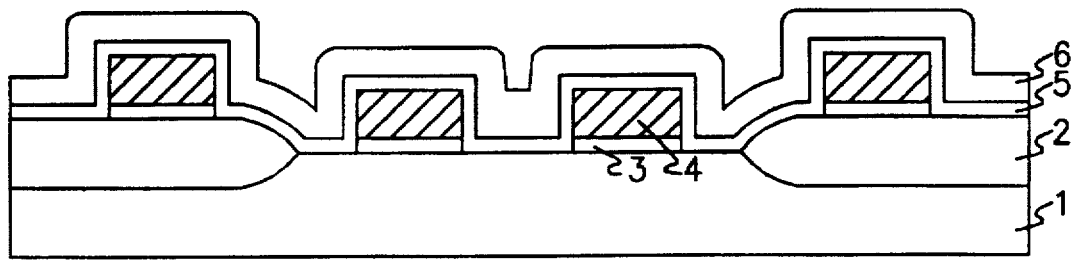

First, as shown in FIG. 1A, a field oxide 2 is selectively formed on a silicon substrate 1, to define an isolation region and active region, and a gate oxide 3 and polysilicon pattern 4 are formed on a predetermined portion of the isolation region and active region. Then, undoped oxide is deposited on the overall surface of the substrate to form dopant-diffusion stop 5, and BPSG 6 is deposited on the dopant-diffusion stop 5 through chemical vapor deposition in order to planarize the overall surface of the substrate.

Figure 1B:
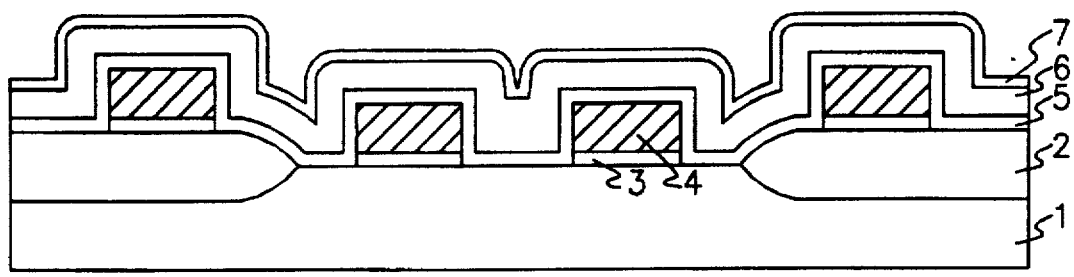

As shown in FIG. 1B, a material of an alcohol group such as ethyl alcohol, isopropyl alcohol or methyl alcohol is coated on the overall surface of the substrate, and the substrate on which the alcohol material is coated is turn spin at the revolutions per minute of 0 to 500 for 5 to 20 seconds and dried. By doing so, thin alcohol film 7 is formed on the BPSG layer 6, preventing moisture from being absorbed into the BPSG layer from the air.

Figure 1C:
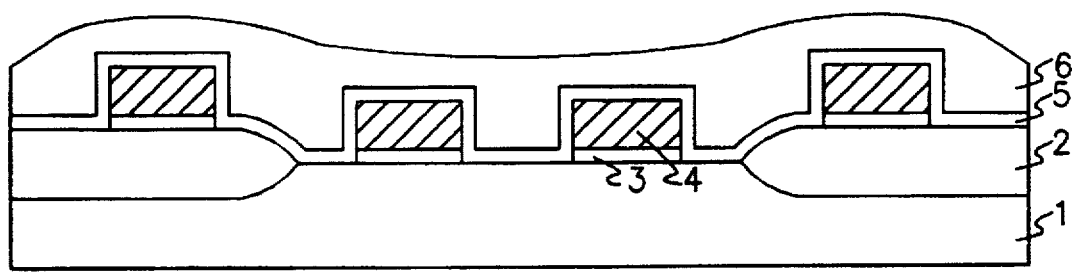

As shown in FIG. 1C, heat treatment at high temperature is carried out, to planarize the overall surface of the substrate while the flow characteristic of the BPSG layer is not obstructed.

In the present invention as described above, low concentration thin insulating layer is deposited, or cheap material of alcohol is coated using spin coating apparatus in order to restrain moisture absorption according to increment of the dopant concentration of the impurity-contained insulating layer, preventing moisture absorption. This keeps the thin impurity-contained insulating layer stable even if delay time to the following heat treatment is long, preventing transformation of the nature of the layer.

What is claimed is:

1. A method for preventing moisture from being absorbed into an insulating layer of a semiconductor device containing impurities, comprising the steps of:
    forming a glass containing boron and/or phosphorous containing insulating layer on a substrate of a semiconductor device; and
    coating an alcohol on said impurity-containing insulating layer, to form an alcohol film,
    wherein said alcohol is a member selected from the group consisting of ethyl alcohol, isopropyl alcohol and methyl alcohol.

2. The method as claimed in claim 1, wherein said impurity-containing insulating layer is BPSG layer.

3. The method as claimed in claim 1, wherein said alcohol film is formed by spin coating at 0 to 500 revolutions per minute for 5 to 20 seconds, and drying.

* * * * *